(12) United States Patent
Namkung et al.

(10) Patent No.: US 11,251,173 B2
(45) Date of Patent: *Feb. 15, 2022

(54) DISPLAY DEVICE WITH A CHIP ON FILM

(71) Applicant: Samsung Display Co., Ltd., Yongin-si (KR)

(72) Inventors: Jun Namkung, Yongin-si (KR); Soon Ryong Park, Yongin-si (KR); Ju Yeop Seong, Yongin-si (KR); Hyun Kyu Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/869,899

(22) Filed: May 8, 2020

(65) Prior Publication Data

US 2020/0266183 A1    Aug. 20, 2020

Related U.S. Application Data

(63) Continuation of application No. 16/217,498, filed on Dec. 12, 2018, now Pat. No. 10,651,162, which is a
(Continued)

(30) Foreign Application Priority Data

Jun. 30, 2016    (KR) .................. 10-2016-0082847

(51) Int. Cl.
*H01L 25/18*    (2006.01)
*H01L 51/52*    (2006.01)
(Continued)

(52) U.S. Cl.
CPC .......... *H01L 25/18* (2013.01); *H01L 27/3276* (2013.01); *H01L 51/5237* (2013.01);
(Continued)

(58) Field of Classification Search
CPC . H01L 25/18; H01L 51/5237; H01L 23/5386; H01L 51/5181; H01L 27/124;
(Continued)

(56) References Cited

U.S. PATENT DOCUMENTS 7,593,085 B2    9/2009    Watanabe et al.
8,956,922 B2    2/2015    Peil et al.
(Continued)

FOREIGN PATENT DOCUMENTS

JP    2013-537005    9/2013
JP    2016-045371    4/2016
(Continued)

OTHER PUBLICATIONS

Non-Final Office Action dated Feb. 15, 2018, in U.S. Appl. No. 15/602,030.
(Continued)

*Primary Examiner* — Alexander O Williams
(74) *Attorney, Agent, or Firm* — H.C. Park & Associates, PLC

(57) ABSTRACT

A display device including a display panel including a substrate, pixels provided on the substrate, and first lines connected to the pixels, the display device having a bending area where the display panel is bent. The display panel also includes a chip on film overlapping with a portion of the display panel and having second lines, an anisotropic conductive film provided between the chip on film and the display panel connecting the first lines and the second lines, and a coating layer covering the bending area and one end of the chip on film. In such a device, lines of the chip on film may be prevented from being corroded as they may be spaced apart from an edge of an insulating film.

19 Claims, 9 Drawing Sheets

Related U.S. Application Data continuation of application No. 15/602,030, filed on May 22, 2017, now Pat. No. 10,177,129.

(51) Int. Cl.
  *H01L 27/32* (2006.01)
  *H01L 23/538* (2006.01)
  *H01L 27/12* (2006.01)

(52) U.S. Cl.
  CPC ...... *H01L 23/5385* (2013.01); *H01L 23/5387* (2013.01); *H01L 27/124* (2013.01); *H01L 51/5281* (2013.01)

(58) Field of Classification Search
  CPC . H01L 51/5281; H01L 23/5387; H01L 27/32; H01L 51/52
  USPC ........................................................ 257/779
  See application file for complete search history.

(56) References Cited

U.S. PATENT DOCUMENTS

| | | | |
|---|---|---|---|
| 9,276,055 B1* | 3/2016 | Son | H01L 27/323 |
| 9,287,329 B1* | 3/2016 | Lee | H01L 27/1218 |
| 9,287,334 B2* | 3/2016 | Jung | H01L 51/5246 |
| 9,857,908 B2 | 1/2018 | Choi | |
| 9,941,335 B2 | 4/2018 | Park et al. | |
| 10,159,147 B2 | 12/2018 | Kim | |
| 10,177,129 B2* | 1/2019 | Namkung | H01L 25/18 |
| 10,651,162 B2* | 5/2020 | Namkung | H01L 25/18 |
| 2009/0121349 A1 | 5/2009 | Suzuki | |
| 2016/0056222 A1 | 2/2016 | Odaka et al. | |
| 2016/0172428 A1 | 6/2016 | Song et al. | |
| 2016/0172623 A1 | 6/2016 | Lee | |
| 2016/0181345 A1* | 6/2016 | Lee | H01L 51/0097 257/40 |
| 2016/0205781 A1* | 7/2016 | Chan | G02F 1/13452 361/749 |
| 2017/0285815 A1 | 10/2017 | Yamazaki et al. | |
| 2017/0287814 A1 | 10/2017 | Kim et al. | |
| 2017/0338198 A1 | 11/2017 | Jang et al. | |
| 2017/0338246 A1 | 11/2017 | Kubota et al. | |
| 2017/0352834 A1 | 12/2017 | Kim et al. | |
| 2017/0373036 A1 | 12/2017 | Yamazaki et al. | |
| 2018/0025991 A1 | 1/2018 | Koketsu et al. | |
| 2018/0286316 A1* | 10/2018 | Yuki | G02F 1/133308 |

FOREIGN PATENT DOCUMENTS

| | | |
|---|---|---|
| KR | 10-0770439 | 10/2007 |
| KR | 10-2016-0029192 | 3/2016 |
| KR | 10-2016-0036716 | 4/2016 |
| KR | 10-2016-0046980 | 5/2016 |

OTHER PUBLICATIONS

Notice of Allowance dated Aug. 29, 2018, in U.S. Appl. No. 15/602,030.
Non-Final Office Action dated Sep. 19, 2019, in U.S. Appl. No. 16/217,498.
Notice of Allowance dated Jan. 10, 2020, in U.S. Appl. No. 16/217,498.

* cited by examiner

DISPLAY DEVICE WITH A CHIP ON FILM

CROSS-REFERENCE TO RELATED APPLICATION

This application is a Continuation of U.S. patent application Ser. No. 16/217,498, filed on Dec. 12, 2018, now issued as U.S. Pat. No. 10,651,162, which is a Continuation of U.S. patent application Ser. No. 15/602,030, filed on May 22, 2017, now issued as U.S. Pat. No. 10,177,129, and claims priority from and the benefit of Korean Patent Application No. 10-2016-0082847, filed on Jun. 30, 2016, each of which is hereby incorporated by reference for all purposes as if fully set forth herein.

BACKGROUND

Field

Exemplary embodiments relate to a display device, and more particularly, to a display device that includes a chip on film.

Discussion of the Background

An organic light emitting display device includes two electrodes and an organic light emitting layer disposed between the two electrodes, wherein an electron injected from one of the electrodes and a hole injected from the other one of the electrodes are coupled to each other in the organic light emitting layer, forming an exciton which emits light while releasing energy.

Such an organic light emitting display device may be driven by a signal from a driver connected through a chip on film (COF).

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display device which prevents the corrosion of the lines of a chip on film.

Additional aspects will be set forth in the detailed description which follows, and, in part, will be apparent from the disclosure, or may be learned by practice of the inventive concept.

An exemplary embodiment discloses a display device that includes a display panel including a substrate, pixels provided on the substrate, and first lines connected to the pixels, the display device having a bending area where the display panel is bent. The display panel also includes a chip on film overlapping with a portion of the display panel and having second lines, an anisotropic conductive film provided between the chip on film and the display panel connecting the first lines and the second lines, and a coating layer covering the bending area and one end of the chip on film.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
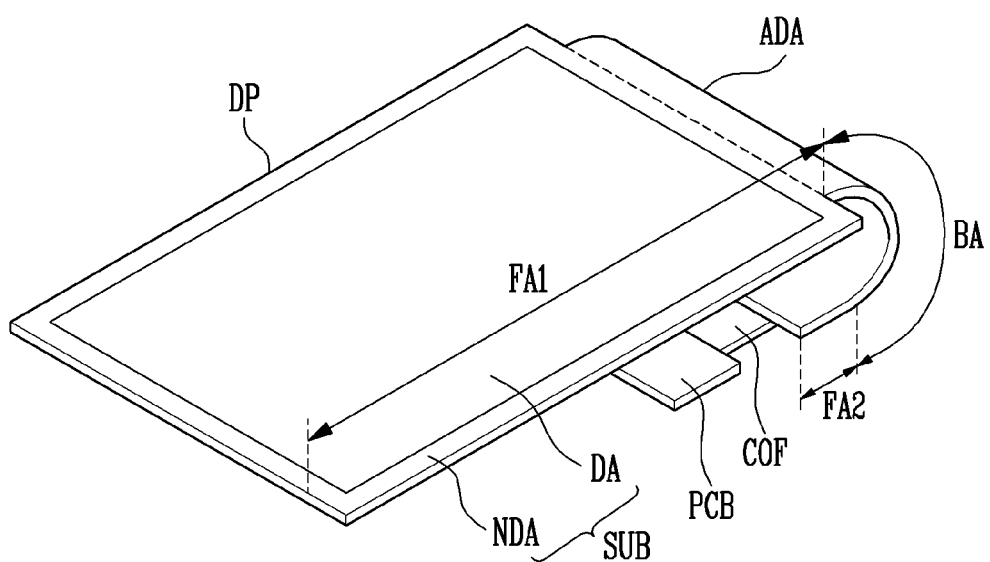
FIG. 1 is a perspective view illustrating a display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
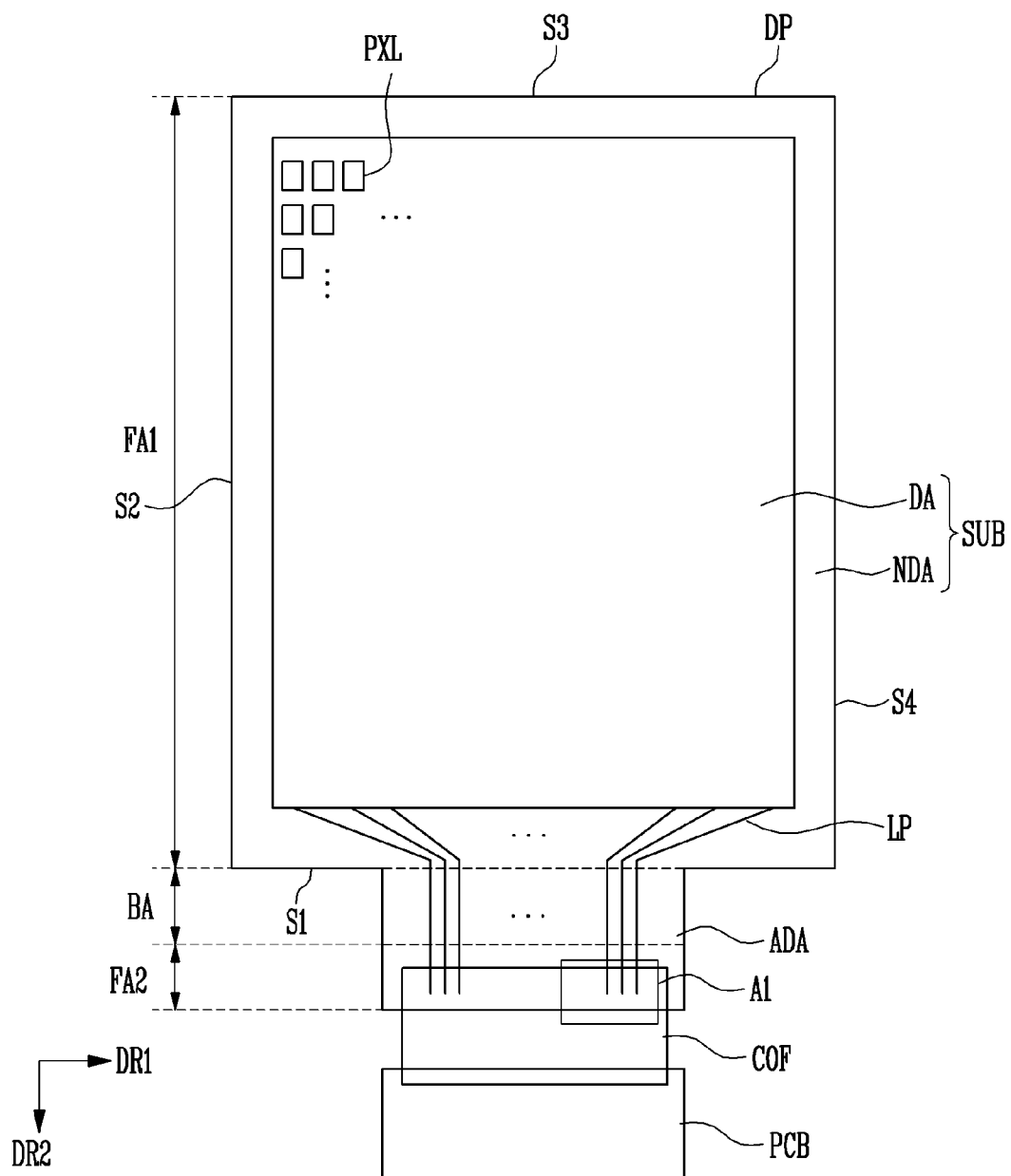
FIG. 2 is a plan view illustrating the display device of FIG. 1.

FIG. 1 is a perspective view illustrating a display device according to an exemplary embodiment of the present disclosure, and FIG. 2 is a plan view illustrating the display device of FIG. 1.

Referring to FIGS. 1 and 2, a display device according to an exemplary embodiment includes a display panel DP, and a driving circuit board connected to the display panel DP.

According to an exemplary embodiment, the display panel DP includes a substrate SUB, pixels PXL provided on the substrate SUB, and lines LP connected to the pixels PXL.

The substrate SUB includes a display area DA and a non-display area NDA provided in at least one side of the display area DA.

The substrate SUB may have a generally quadrangular shape, more particularly, a rectangular shape. In an exemplary embodiment, the substrate SUB may include a pair of short sides parallel to each other in a first direction DR1 and a pair of long sides parallel to each other in a second direction DR2. In the present embodiment, for convenience of explanation, the sides of the substrate SUB are indicated as four sides, that is, a first side Si to a fourth side S4, connected sequentially starting from one short side.

However, the shape of the substrate SUB is not limited thereto, and may vary. For example, the substrate SUB may be provided in various shapes such as a closed polygonal shape that includes a side made of a straight line, a circle or an ellipse that includes a side made of a curve, a semi-circle or a semi-ellipse that includes a side made of a straight line and a side made of a curve, etc. In an exemplary embodiment, in the case where the substrate SUB has a side made of a straight line, at least a portion of a corner having an angular shape may be made of a curve. For example, in the case where the substrate SUB has a rectangular shape, a portion where straight sides adjacent to each other meet may be replaced by a curve having a certain curvature. That is, a vertex portion of the rectangular shape may consist of a curved side of which both ends adjacent to each other are each connected to two straight side, the curved side having a certain curvature. The curvature of the curved side may vary depending on its position. For example, the curvature may vary depending a position where the curve starts and a length of the curve, etc.

The display area DA is an area where a plurality of pixels PXL are provided, and thus where images may be displayed.

The display area DA may be provided in a shape corresponding to the shape of the substrate SUB. For example, the display area DA may be provided in various shapes such as a closed polygonal shape that includes a side made of a straight line, a circle or an ellipse that includes a side made of a curve, a semicircle or a semiellipse that includes a side made of a straight line and a side made of a curve, etc., just as the shape of the substrate SUB. In an exemplary embodiment, in the case where the display area DA has a side made of a straight line, at least a portion of a corner having an angular shape may be made of a curve.

The pixels PXL may be provided on the display area DA of the substrate SUB. Each pixel PXL is a minimum unit for displaying an image, and the pixel PXL may be provided in plural. The pixels PXL may output a white light and/or a color light. Each pixel PXL may output one of colors such as red, green and blue, etc., but without limitation, that is, each pixel PXL may instead output one of colors such as cyan, magenta, and yellow, etc.

The pixel PXL may be a light emitting device that includes an organic light emitting layer. However, the pixel PXL may be realized in various forms such as a liquid crystal device, an electrophoretic device, or an electrowetting device, etc.

Figure 3:
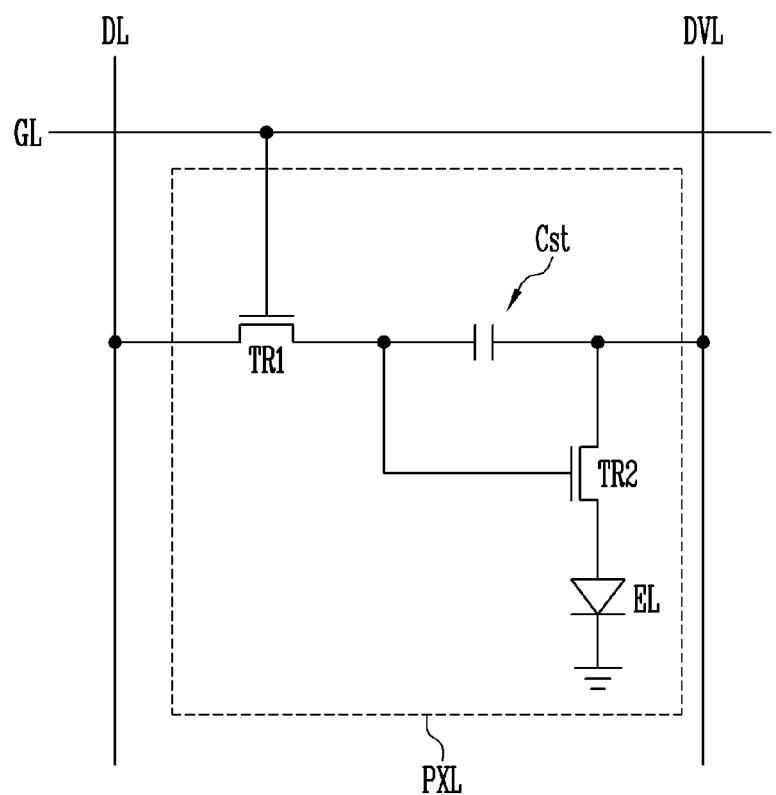
FIG. 3 is a equivalent circuit diagram of a case where a pixel is a light emitting device according to an exemplary embodiment.

FIG. 3 is an equivalent circuit diagram illustrating the case where the pixel PXL is a light emitting device according to an exemplary embodiment.

Referring to FIG. 3, each pixel PXL includes a thin film transistor connected to lines, a light emitting device EL connected to the thin film transistor and a capacitor Cst.

The thin film transistor may include a driving thin film transistor TR2 for controlling the light emitting device, and a switching thin film transistor TR1 for switching the driving thin film transistor TR2. Although it is explained in the present exemplary embodiment that one pixel PXL includes two thin film transistors TR1, TR2, this is not meant as a limitation That is, one pixel PXL may be provided with one thin film transistor and one capacitor, or one pixel PXL may be provided with three or more thin film transistors and two or more capacitors. For example, one pixel may include seven thin film transistors, light emitting devices, and storage capacitors.

The switching thin film transistor TR1 includes a gate electrode, a source electrode and a drain electrode. In the switching thin film transistor TR1, the gate electrode is connected to a gate line GL, and the source electrode is connected to a data line DL. The drain electrode is connected to a gate electrode of the driving thin film transistor TR2. The switching thin film transistor TR1 transmits a data signal being applied to the data line DL to the driving thin film transistor TR2 according to a scan signal being applied to the gate line.

The driving thin film transistor TR2 includes the gate electrode, a source electrode and a drain electrode. In the driving thin film transistor TR2, the gate electrode is connected to the switching thin film transistor TR1, the source electrode is connected to the driving voltage line DVL, and the drain electrode is connected to the light emitting device EL.

The light emitting device EL may include a light emitting layer, and a first electrode and a second electrode facing each other with the light emitting layer disposed therebetween. The first electrode may be connected to the drain electrode of the driving thin film transistor TR2. The second electrode may be connected to a power line (not illustrated) to be supplied with a common voltage. The light emitting layer may or may not emit light according to an output signal of the driving thin film transistor TR2, thereby displaying an image. The light being emitted from the light emitting layer may vary depending on the material of the light emitting layer, for example, the light may be a color light or a white light.

The capacitor Cst may be connected between the gate electrode and the source electrode of the driving thin film transistor TR2, and may be configured to charge and maintain a data signal being input into the gate electrode of the driving thin film transistor TR2.

Referring to FIGS. 1, 2, and 3, a plurality of the pixels PXL may be provided and arranged in a matrix form along a line extending in a first direction DR1 and a row extending in a second direction DR2. However, the arrangement of the pixels PXL is not limited to the aforementioned, and may vary. For example, the pixels PXL may be arranged in a line direction, or in a direction slanted against the line direction.

The non-display area NDA is an area that is not provided with the pixels PXL, and thus does not display an image.

The non-display area NDA may be provided with lines LP connected to the pixels PXL, and a driver connected to the lines LP and configured to drive the pixels PXL.

The lines LP may be connected to the pixels PXL, and provide a signal to each of the pixels PXL. The lines LP may include a gate line GL, a data line DL, a driving voltage line DVL and a power line, etc. The lines LP may further include other lines if necessary.

The lines LP may be provided to extend across the display area DA and the non-display area NDA.

The lines LP are connected to the driver (not illustrated). The driver provides a signal to each of the pixels PXL through the lines LP, and controls operations of each pixel PXL, accordingly.

The driver may include a gate driver (not illustrated) that provides a scan signal to each of the pixels PXL through a scan line, a data driver (not illustrated) that provides a data signal to each of the pixels PXL through a data line, and a timing controller (not illustrated) that controls the gate driver and the data driver.

In an exemplary embodiment, the gate driver may be mounted directly on the substrate SUB. In the case of mounting the gate driver directly on the substrate SUB, it may be possible to form the gate driver together in the process of forming the pixels PXL. However, the position or method for providing the gate driver is not limited to the aforementioned, that is, the gate driver may either be provided on the substrate SUB in a chip on glass form, or the gate driver may be mounted on a printed circuit board PCB that will be explained hereinafter and then connected to the substrate SUB through a connecting member.

In an exemplary embodiment, the data driver may be mounted directly on the substrate SUB, but there is no limitation thereto, that is, the data driver may be formed in a separate chip and then connected to the substrate SUB. In an exemplary embodiment, in the case of forming the data driver in a separate chip to be connected to the substrate SUB, it is possible to form the data driver in a chip on glass, in a chip on film COF or in a printed circuit board PCB that will be explained hereinafter, and then connect the same to the substrate SUB.

In the present exemplary embodiment, the data driver is exemplified as one that is produced in a chip on film COF form and connected to the substrate SUB.

In an exemplary embodiment, the non-display area NDA may further include an additional area ADA protruding from a portion of the non-display area NDA. The additional area ADA may be protruding from the sides forming the non-display area NDA. In the present exemplary embodiment, the additional area ADA is exemplified as one protruding from one of the short sides of the substrate SUB. However, the additional area ADA may be configured to protrude from one of the long sides of the additional area ADA instead, or to protrude from two or more of the four sides of the additional area ADA. In an exemplary embodiment, the additional area ADA may be provided with the data driver or may be connected to the data driver, but there is no limitation thereto, that is, other various elements may be disposed in the additional area ADA.

In an exemplary embodiment, the display device of the present disclosure may partially have flexibility, so that it may be bent in the portion having flexibility. That is, the display device may include a bending area BA having flexibility and bent in one direction, and flat areas FA1, FA2 that are provided in at least one side of a foldable area and that are not bent but are flat. The flat areas FA1, FA2 may or may not have flexibility.

In the present exemplary embodiment, the bending area BA is exemplified as being provided in the additional area ADA. In an exemplary embodiment, there may be provided a first flat area FA1 and a second flat area FA2 spaced apart from each other with the bending area BA disposed therebetween, and the first flat area FA1 may include the display area DA. In an exemplary embodiment, the bending area BA may be spaced apart from the display area DA.

In an exemplary embodiment, the first flat area FA1 and the second flat area FA2 may be spaced apart from each other with the bending area BA disposed therebetween. The display panel DP may be bent in the bending area BA, and accordingly, the first flat area FA1 and the second flat area FA2 may be arranged parallel to each other.

Assuming the line by which the display device is bent is a bending line, the bending line is provided in the bending area BA. The term "bending" is used to mean that a shape is not fixed but may be transformed from its original shape to another shape, for example, being folded, curved or rolled up like a scroll along two or more certain lines, i.e., the bending line. Therefore, in the present exemplary embodiment, the display device is bent such that one surface of one flat areas FA1 and one surface of the other flat area FA2 face each other, but there is no limitation thereto, that is, the display device may be bent such that the surfaces of the two flat areas form a certain angle against each other, for example, an acute angle, a right angle or an abtuse angle.

In an exemplary embodiment, the additional area ADA may subsequently be bent by the bending line, in which case a width of a bezel may be reduced as the additional area ADA is bent.

The driving circuit board is provided with a driver, and the driving circuit board provides a signal to each of the pixels PXL through the lines LP. Accordingly, the driving circuit board may control operations of each of the pixels PXL, and thus the driving circuit board may include the gate driver that provides a scan signal to each of the pixels PXL, the data driver that provides a data signal to each of the pixels PXL, and the timing controller that controls the gate driver and the gate driver. However, as mentioned above, the gate driver and the data driver may be mounted at various locations, for example, in the display panel DP.

The driving circuit board may include a chip on film COF connected to the display panel DP. Further, the driving circuit board may further include a printed circuit board PCB connected to the chip on film COF.

The chip on film COF may process various signals being input from the printed circuit board PCB and output the processed signals towards the display panel DP. For this purpose, one end of the chip on film COF may be attached to the display panel DP, and another end of the chip on film COF, that is opposite to said one end may be attached to the printed circuit board PCB. Explanation on the connection relationship between the chip on film COF and the display panel DP will be made later on.

On the printed circuit board PCB, various driving circuits such as a timing driver and the like may be mounted, and the printed circuit board PCB may output various signals received from the driving circuits towards the chip on film COF. Examples of the printed circuit board PCB that may be used herein include a flexible printed circuit board FPCB.

The printed circuit board PCB may be disposed on one surface or on a rear surface of the display panel DP. Generally, a display panel DP displays an image on its front surface, in which case the rear surface of the display panel DP becomes an area that cannot be seen by a user. Therefore, in order to maximize space efficiency and hide the elements that need not be seen by the user, the printed circuit board PCB may be disposed on the rear surface of the display panel DP. However, this is just an example, that is, the printed circuit board PCB may be disposed on a side surface of the display panel, or instead, the printed circuit board board PCB may be formed integrally with the chip on film COF.

Figure 4A:
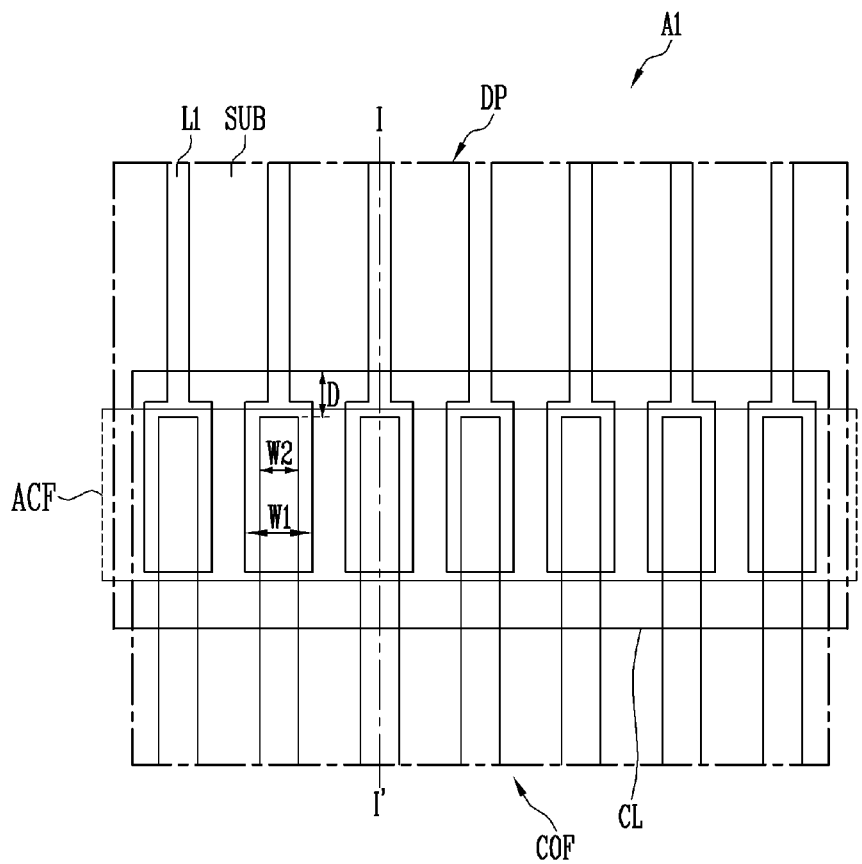
FIG. 4A is an exploded plan view of portion A1 of FIG. 2 where a display panel and a chip on film are connected to each other in a display device according to an exemplary embodiment.
Figure 4B:
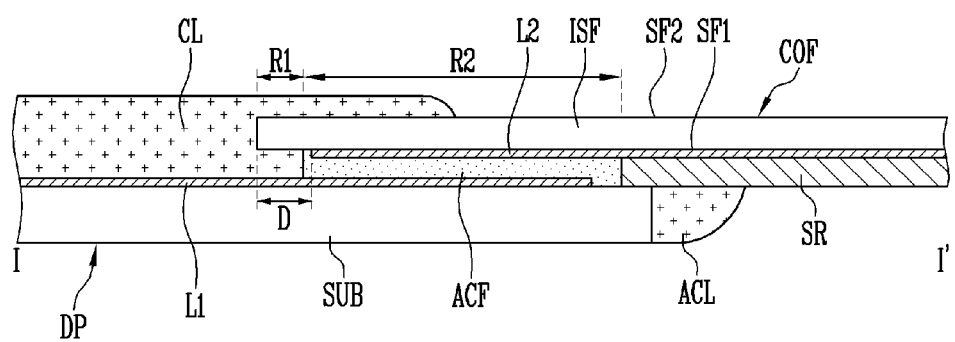
FIG. 4B is a cross-sectional view taken on line IV-IV' of FIG. 4A.
Figure 5A:
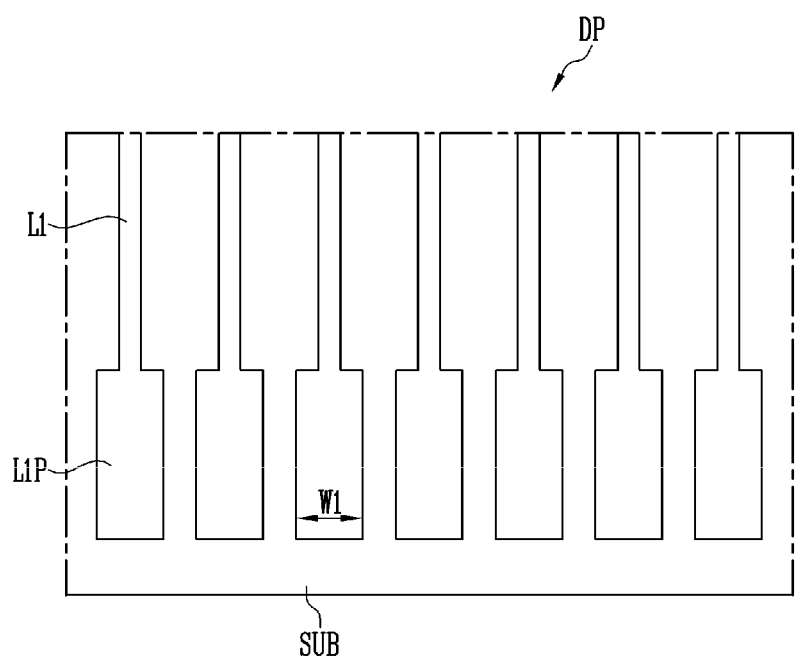
FIG. 5A is a plan view illustrating the display panel in FIG. 4A.
Figure 5B:
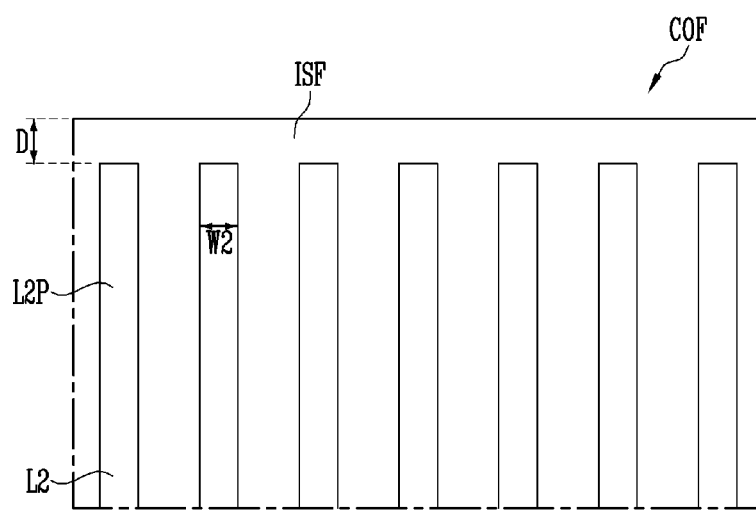
FIG. 5B is a plan view illustrating the chip on film in FIG. 4A.

FIG. 4A is an exploded plan view of A1 portion of FIG. 2 where the display panel DP and the chip on film COF are connected to each other in the display device according to an exemplary embodiment of the present disclosure. FIG. 4B is a cross-sectional view taken on line IV-IV' of FIG. 4A. FIG. 5A is a plan view of the display panel DP in FIG. 4A, and FIG. 5B is a plan view of the chip on film COF in FIG. 4A.

Referring to FIGS. 2, 3, 4A, 4B, 5A, and 5B, the display device according to an exemplary embodiment includes the display panel DP, the chip on film COF that partially overlaps with the display panel DP, an anisotropic conductive film ACF provided between the chip on film COF and the display panel DP, the bending area BA (see FIG. 1) in which the display panel DP is bent, and a coating layer CL that covers the one end of the chip on film COF.

In an exemplary embodiment, the display panel DP is provided with lines, and the chip on film COF is also provided with lines connected to the lines of the display panel DP, and thus, for convenience of explanation, hereinafter, the lines of the display panel DP will be referred to as first lines L1, and the lines of the chip on film COF will be referred to as second lines L2.

The display panel DP may have the substrate SUB, the pixels PXL (see to FIG. 2) provided on the substrate, and the first lines L1 connected to the pixels PXL.

The substrate SUB may be made of an insulating material such as glass and resin, etc. Additionally, the substrate SUB may be made of a material having flexibility so that it may be bent or folded, and the substrate SUB may have a structure of a single layer or a structure of multiple layers.

For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose and cellulose acetate propionate. However, the material forming the substrate SUB may vary. For example, the substrate SUB may be made of fiber reinforced plastic FRP as well.

The pixel PXL may be a light emitting device that includes an organic light emitting layer, but without limitation, that is, the pixel PXL may be realized in various forms such as a liquid crystal element, an electrophoretic element, and an electro-wetting device, etc.

In the present exemplary embodiment, the pixels PXL are provided as light emitting devices EL that include the thin film transistor TR1, TR2, a light emitting device EL connected to the thin film transistor TR1, TR2, and the capacitor Cst. The thin film transistor TR1, TR2, the light emitting device EL and the capacitor Cst may be realized in various forms using an insulating layer, a conductive layer, a semiconductor layer and an organic light emitting layer, etc.

The first lines L1 may connect the driver and the pixels PXL. The lines LP may include gate lines GL, data lines DL, driving voltage lines DVL and power lines, etc. In an exemplary embodiment, the lines forming the lines LP may be data lines, but without limitation, that is, the lines forming the lines LP may of course vary.

The first lines L1 may be made of metal. For example, the first lines L1 may be made of metal of at least one of gold (Au), silver (Ag), aluminum (Al), molybdenum (Mo), chrome (Cr), titanium (Ti nickel (Ni), neodynium (Nd), and copper (Cu), or an alloy thereof. Further, the first lines L1 may each be formed as a single layer line, but without limitation, that is, the first lines L1 may each be formed as a line consisting of mulitple layers where two or more of the aforementioned metals and alloys thereof are laminated.

However, the material of the first lines L1 is not limited to the aforementioned. In an exemplary embodiment, additional lines necessary for driving the pixels PXL may be provided in the non-display area NDA besides the data line(s) aforementioned.

The first lines L1 may extend from the pixels to an end of the additional area ADA in the second direction DR2, and in the portion where the display panel DP and the chip on film COF overlap with each other, the first lines L1 may generally extend in the second direction DR2, as illustrated.

At the end of the additional area ADA in the second direction DR2, each of the lines L1 has first pads L1P provided at an end thereof. Each of the first pads L1P of the first lines L1 may have a width that is the same as or greater than that of each of the first lines L1 connected thereto. The first lines L1 may be connected to the driver realized on the chip on film COF and/or printed circuit board PCB through the first pads LIP.

The chip on film COF may be connected to an end of the display panel DP, and connects the pixels PXL in the display panel DP and the driver. The chip on film COF may include an insulating film ISF and the second lines L2 provided on the insulating film ISF. The chip on film COF collectively refers to the insulating film made of a thin film and the lines formed on the insulating film. The chip on film COF may be referred to as a tape carrier package, a flexible printed circuit board or the like.

Although not illustrated, in the chip on film COF, besides the second lines L2, the insulating film ISF may be further provided with a semiconductor chip connected to at least a portion of the second lines L2. The semiconductor chip may be at least a portion of the driver.

The insulating film ISF has a first surface SF1 and a second surface SF2 that are opposite to each other, the second lines L2 being disposed on the first surface SF1.

The insulating film ISF may be made of an insulating material. The substrate SUB may be made of an insulating material such as glass and resin, etc. Further, the substrate SUB may be made of a flexible material so that it may be bent or folded, and the substrate SUB may have a structure of a single layer or a structure of multiple layers.

For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose and cellulose acetate propionate. However, the material forming the substrate SUB may vary. For example, the substrate SUB may be made of fiber reinforced plastic FRP and the like.

At one end of each of the second lines L2, a second pad L2P may be provided. The second pads L2P of the second lines L2 may each have a width that is the same as or greater than that of each of the second lines L2. FIGS. 4A and 5B illustrate that each of the second pads L2P of the second lines L2 is formed to have the same width as that of each of the second lines L2, but there is no limitaiton thereto.

The first surface SF1 of the chip on film COF may be arranged in a direction facing the display panel DP. The second lines L2 may correspond to the first lines L1 one by one, and the first lines L1 and the second lines L2 face each other. In a plan view, each of the first pads L1P of the first lines L1 and each of the second pads L2P of the second lines L2 may overlap with each other. Assuming that the width of each of the first pads L1P of the first lines L1 is a first width W1 and a width of each of the second pads L2P of the second lines L2 is a second width W2, the first width W1 and the second width W2 have values large enough for each of the first pads L1P and each of the second pads L2P to overlap with each other. The first width W1 and the second width W2 may be identical to or different from each other. In the drawings of the embodiments of the present disclosure, the first width W1 is illustrated to be greater than the second width W2, but there is no limitation thereto, that is, the second width W2 may be greater than the first width W1.

In an exemplary embodiment, in a plan view, the second pads L2P are spaced apart from the edge of the insulating film ISF. That is, the second pads L2P do not contact the edge of the insulating film ISF, and the second pads L2P are not formed within an area of a certain distance D from the edge.

The second lines L2 may be made of metal just as the first lines. For example, the second lines L2 may be made of metal of at least one of gold (Au), silver (Ag), aluminum (Al), molybdenum (Mo), chrome (Cr), titanium (Ti), nickel (Ni), neodynium (Nd), and copper (Cu), or an alloy thereof. Further, the second lines L2 may each be made of a single layer, but without limitation, that is, the second lines L2 may each be made of multiple layers where two or more of the aforementioned metals and alloys thereof are laminated. However, the material of the second lines L2 is not limited thereto.

The chip on film COF may be produced in a method for forming the second lines L2 made of metal on the insulating film ISF. Examples of the method for forming the second lines L2 include a casting method, a laminating method, and an electrogilding method, etc.

The anisotropic conductive film ACF may be provided between the display panel DP and the chip on film COF to connect the display panel DP and the chip on film COF. The anisotropic conductive film ACF may be provided between the first pads L1P of the first lines and the second pads L2P of the second lines L2, in a cross-sectional view. In a plan view, the anisotropic conductive film ACF may overlap with the pads of the chip on film COF. The anisotropic conductive film ACF may also be provided such that it is spaced by a certain distance from the edge of the insulating film ISF.

The anisotropic conductive film ACF may include an organic polymer and a plurality of conductive balls inside the organic polymer.

The organic polymer may be a curable resin that has adhesiveness and that is curable by heat or light. The curable resin may be made of a thermosetting resin. Examples of the thermosetting resin that may be used herein include bisphenol A type epoxy resin, bisphenol F type resin, novolak type epoxy resin, phenol resin, urea resin, melamine resin, unsaturated polyester resin, resorcinol resin and the like, but without limitation. The organic polymer may also be made of a thermoplastic resin. Examples of the thermoplastic resin that may be used herein include saturated polyester resin, vinyl resin, acryl resin, polyolefin resin, polyvinylacetate PVA resin, polycarbonate resin, cellulose resin, ketone resin, sytrene resin and the like, but without limitation.

The conductive balls may be made of metal such as gold, silver, tin, nickel chrome, iron, cobalt, platinum, and copper and an alloy thereof. Alternatively, the conductive balls may be made of a core that includes glass, ceramic or polymer resin, and the aforementioned metal or alloy thereof formed on the core surface.

The anisotropic conductive film ACF may be provided between the first pads L1P and the second pads L2P. When the first pads L1P and the second pads L2P are compressed, the first pads L1P and the second pads L2P are electrically connected through the conductive balls.

The coating layer CL may be provided at one end of the display panel DP and the chip on film COF, thereby covering the one end of the display panel DP and the chip on film COF. In the present embodiment of the present disclosure, the coating layer CL is illustrated as being formed as a single layer, but without limitation, that is, the coating layer CL may be formed to have a structure of multiple layers including two or more layers.

The coating layer CL may control a point to which a stress is to be applied within the display panel DP when the display panel DP is being bent. This will be explained in more detail later on.

The coating layer CL may be filled between a first area R1 of the chip on film COF and the display panel DP. Assuming that the area of the chip on film COF contacting the end of the insulating film but overlapping with the anisotropic conductive film ACF is a first area R1, and the area of the chip on film COF not overlapping with the anisotropic conductive film ACF is a second area R2, the coating layer CL is filled in the second area R2.

By covering the end of the display panel DP and the chip on film COF, the coating layer CL may serve the function of preventing the chip on film COF from being corroded. The coating layer CL is provided at the end side of the chip on film COF, so that it covers a portion and a side surface of the second surface SF2 of the insulating film, and a portion of the first surface SF1 of the insulating film. Especially, the coating layer CL may be filled between the chip on film COF and the display panel DP, thereby preventing external moisture or oxygen from infiltrating into the second lines L2 of the chip on film COF. Further, the coalting layer CL may serve the function of firmly attaching the display panel DP and the chip on film COF, preventing the chip on film COF from deviating from the display panel DP even when stress is applied to the display panel DP caused by bending.

The coating layer CL may be made of a curable resin that is curable by heat or light. In an exemplary embodiment, the coating layer CL is a photosetting material. Examples of the curable resin that may be used herein include bisphenol A type epoxy resin, bisphenol F type resin, novolak type epoxy resin, phenol resin, urea resin, melamine resin, unsaturated polyester resin, resorcinol resin and the like, but without limitation. The coating layer CL may also be made of a thermoplastic resin. Examples of the thermoplastic resin that may be used herein include saturated polyester resin, vinyl resin, acryl resin, polyolefin resin, polyvinylacetate PVA resin, polycarbonate resin, cellulose resin, ketone resin, sytrene resin and the like, but without limitation.

A solder resist layer SR may be provided on the first surface SF1 of the insulating film. The solder resist layer SR may cover the first surface SF1 of the insulating film and the second lines L2 excluding the second pads L2P, thereby protecting the second lines L2.

The solder resist layer SR is not formed on the end of the chip on film COF. In an exemplary embodiment, in a plan view, the solder resist layer SR partially overlaps with the display panel DP.

The solder resist layer SR may be made of a curable resin that is curable by heat or light. Examples of the curable resin that may be used herein include bisphenol A type epoxy resin, bisphenol F type resin, novolak type epoxy resin, phenol resin, urea resin, melamine resin, unsaturated polyester resin, resorcinol resin and the like, but without limitation. The solder resist layer SR may also be made of a thermoplastic resin. Examples of the thermoplastic resin that may be used herein include saturated polyester resin, vinyl resin, acryl resin, polyolefin resin, polyvinylacetate PVA resin, polycarbonate resin, cellulose resin, ketone resin, sytrene resin, epoxy acryl resin, polyester acryl resin, urethane acryl resin and the like, but without limitation.

In an exemplary embodiment, the solder resist layer SR may be made of a material that is the same as or different from that of the coating layer CL.

Additionally, in the area where the chip on film COF and the display panel DP overlap with each other, the end of the display panel DP may be provided with an additional coating layer ACL. The additional coating layer ACL may cover the side surface of the display panel and a portion of the solder resist layer SR formed on the chip on film COF. The additional coating layer ACL prevents moisture or oxygen from infiltrating into the area where the chip on film COF and the display panel DP are connected. The material of the additional coating layer ACL may be the same as or different from the material of the coating layer CL. According to embodiments, the material forming the additional coating layer ACL may vary.

Figure 6:
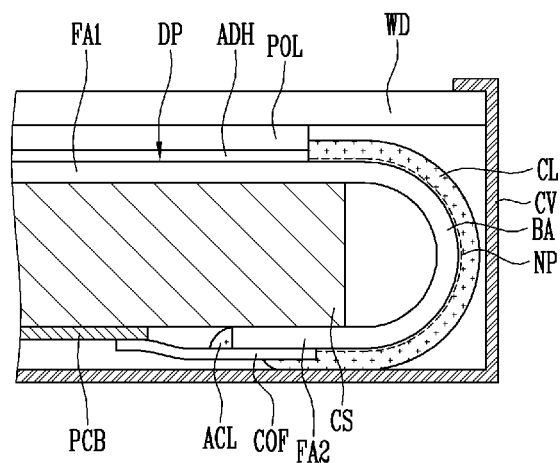
FIG. 6 is a cross-sectional view illustrating a display device according to an exemplary embodiment.

FIG. 6 is a cross-sectional view illustrating the display device according to an exemplary embodiment of the present disclosure.

Referring to FIG. 6, the display device according to an exemplary embodiment may further include a polarizing plate POL provided on the front surface of the display panel, a window WD provided on the front surface of the polarizing plate POL, a cushion member CS provided between the display panel DP and the chip on film COF, and a cover CV for receiving the display panel DP, the polarizing plate POL and the window WD, besides the display panel DP, the chip on film COF, and the printed circuit board board PCB.

The display panel DP displays an image in the front surface direction, and the display panel DP may be bent in the bending area BA. In an exemplary embodiment, the display panel DP may be provided with the first flat area FA1 and the second flat area FA2 that are spaced apart from each other with the bending area BA disposed therebetween, and the first flat area FA1 and the second flat area FA2 may be arranged parallel to each other with the bending area BA disposed therebetween.

One end of the chip on film COF may be connected to one end of the display panel DP, for example, to one end of the second flat area FA2.

A portion of the display panel DP and a portion of the chip on film COF may be covered by the coating layer CL. The coating layer CL may substantially cover an entirety of an outer circumference of the bending area BA of the display panel DP, and the coating layer CL may extend up to a portion of the first and second flat area FA1, FA2.

The coating layer CL may be made of a curable organic polymer, and the coating layer CL is provided on an upper surface of the display panel DP to have a certain thickness, thereby functioning as a neutral plane adjusting element.

In an exemplary embodiment, in the case where a portion of the display device is being bent, having a certain surface between an inner surface and an outer surface of the display device as a boundary, the inner surface may be compressed, providing a compressive force, and an outer surface of the display device is tensed, providing a tensile force. A neutral plane NP is a surface where a vector sum of the tensile force and the compressive force is zero (0) when the display panel DP is being bent. Therefore, in the neutral plane NP, the bending strain caused by the bending stress applied to the display panel DP becomes zero (0).

The location of the neutral plane NP is determined by the thickness and the modulus of elasticity of each of the layers forming the display panel DP. The layers include the substrate SUB, the first lines L1 and the coating layer CL. That is, by changing the thickness and/or the modulus of elasticity of the coating layer CL in consideration of the thickness and the modulus of elasticity of the first lines L1, it is possible to adjust the location of the neutral plane NP. In an exemplary embodiment, by changing the thickness and/or the modulus elasticity of the coating layer CL, in particular, it is possible to place the neutral plane NP on the upper surface of the substrate, that is in an area where the first lines L1 are arranged.

For example, although the coating layer CL is illustrated as having a substantially identical thickness throughout the entirety of the bending area, there is no limitation thereto, that is, In an exemplary embodiment, the thickness of the coating layer CL may vary throughout the entirety of the bending area. In another exemplary embodiment, the coating layer CL may be made of different materials but have a uniform thickness throughout the entirety of the bending area. In yet another exemplary embodiment, the coating layer CL may be made of multiple layers having different moduluses of elasticity or different thicknesses throughout the entirety of the bending area.

As aforementioned, in the case where the coating layer CL is not provided on the display panel DP, the neutral plane NP may be disposed in a different location from the first lines L1, but in the case where the coating layer CL is provided on the display panel, especially on the first lines L1, the neutral plane NP may be disposed in the same location as the first wires L1. As a result, deformation of the lines L1 may be minimized even when a bending stress occurs in the display panel. Accordingly, the first lines L1 may not crack or be disconnected and defects may not occur in the display device.

The printed circuit board board PCB may be connected to another end of the chip on film COF, and the printed circuit board board PCB may be disposed on the rear direction of the first flat area FA1.

The polarizing plate POL may be provided on the front surface of the display panel DP, that is, on the display area, having an adhesive therebetween. The polarizing plate POL may prevent external light from being reflected. In the present embodiment of the present disclosure, the polarizing plate POL is provided, but without limitation, that is, the polarizing plate may be substituted for another type of optical film. Otherwise, another type of optical film may be provided in addition to the polarizing plate POL.

Although not illustrated in the drawings, a touch sensor may be further provided between the polarizing plate POL and the display panel DP. In an exemplary embodiment, the touch sensor may be provided not between the polarizing plate POL and the display panel DP, but inside the display panel DP.

The window WD may be provided on the polarizing plate POL to protect to the display panel DP. The window WD may be made of a transparent insulating material such as glass and organic polymer, etc. The window WD may be formed to have the same surface area as or a different surface area from that of the display area.

The cushion member CS may be provided on the rear surface of the display panel DP to buffer the impact being applied to the display panel DP. In an exemplary embodiment, the cushion member CS may be provided between the first flat area FA1 and the second flat area FA2 of the display panel DP.

The cushion member CS may be provided as a porous polymer so as to have elasticity. For example, the cushion member CS may be made of foam such as sponge.

For example, the cushion member CS may include thermoplastic elastomer, polystyrene, polyolefin, polyurethane thermoplastic elastomers, polyamides, synthetic rubbers, polydimethylsiloxane, polybutadiene, polyisobutylene, poly(styrene-butadienestyrene, polyurethanes, polychloroprene, polyethylene, silicone, or a combination thereof, but without limitation.

The cover CV may receive the cushion member CS provided between the display panel DP and the chip on film COF, the display panel DP, the polarizing plate POL, the window WD, and the like into a lower surface and a side surface of the cover CV.

Figure 7A:
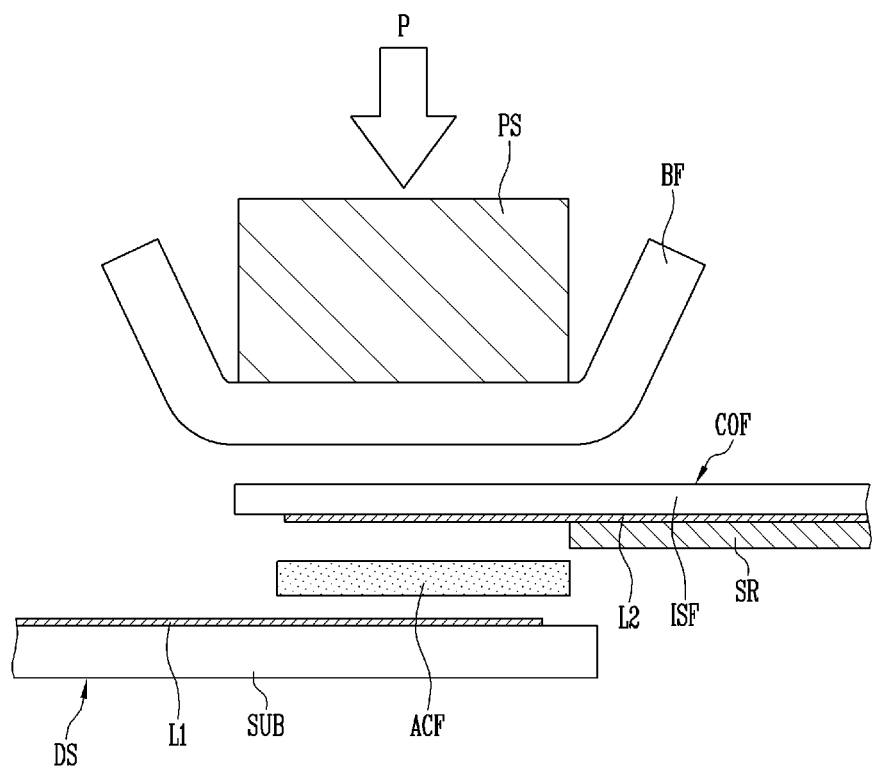
FIGS. 7A, 7B, and 7C are cross-sectional views illustrating a process of attaching a display panel and a chip on film sequentially in a display device according to an exemplary embodiment.
Figure 7B:
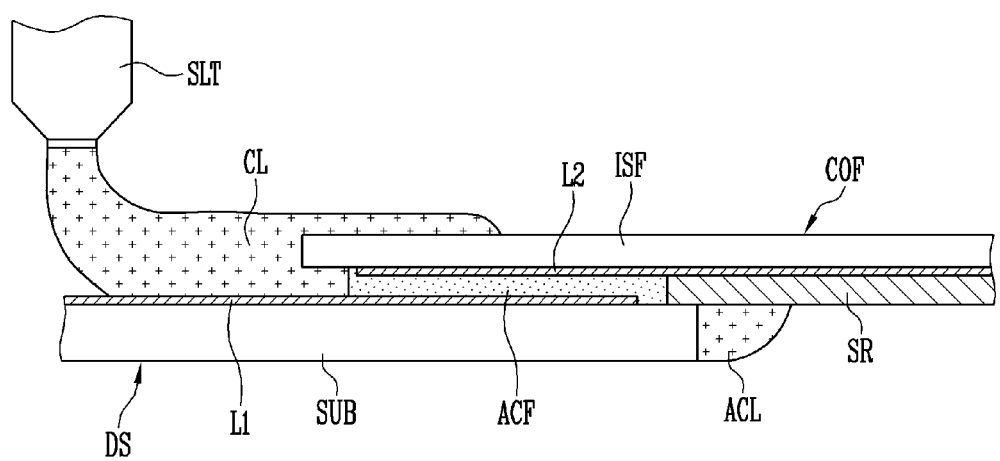
Figure 7C:
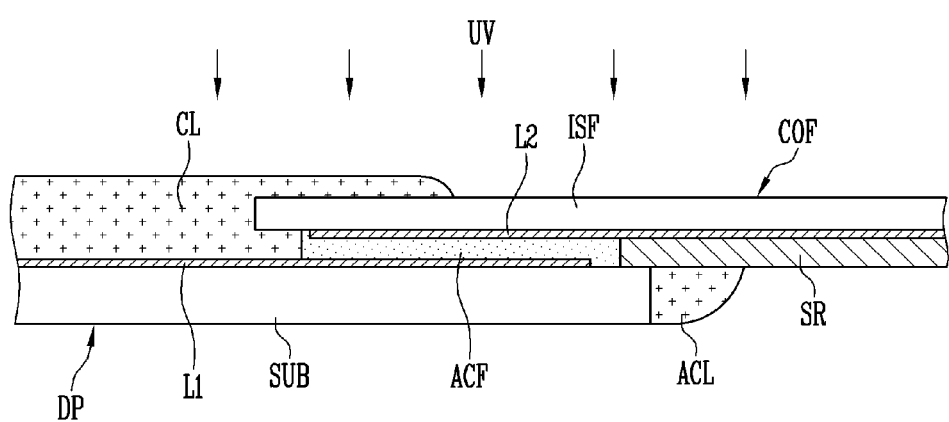

FIGS. 7A, 7B, and 7C are cross-sectional views sequentially illustrating a process of attaching the display panel DP and the chip on film COF in the display device according to an exemplary embodiment of the present disclosure.

Referring to FIG. 7A, the display panel DP and the chip on film COF are prepared.

The display panel DP may be produced by preparing the substrate SUB, and then forming the first lines L1 on the substrate SUB.

The chip on film COF may be produced by preparing the insulating film ISF and forming the second lines L2 on the insulating film ISF. In the chip on film COF, portions excluding the second pads are covered by the solder resist SR.

Next, the anisotropic conductive film ACF may be disposed between the display panel DP and the chip on film COF. The display panel DP and the chip on film COF may be disposed such that the first lines L1 and the second lines L2 face each other having the anisotropic conductive film ACF disposed therebetween.

The display panel DP, the anisotropic conductive film ACF and the chip on film COF may be compressed by a certain pressure P using a compressing device. The compressing device may include a compressing member PS and a buffer member BF that surrounds the compressing member PS. The compressing member PS may further include a heating device, and when compressing the display panel DP, the anisotropic conductive film ACF and the chip on film COF with the compressing device, heat may be transferred to the anisotropic conductive film ACF. With the heat transferred from the compressing device, the organic polymer of the anisotropic conductive film ACF may be cured. Accordingly, by the compressing device, the display panel DP and the chip on film COF are attached having the anisotopic conductive film ACF disposed therebetween.

Next, referring to FIG. 7B, the coating layer CL may be formed on the attached display panel DP and the chip on film COF. In an exemplary embodiment, the coating layer CL may be formed by applying a non-cured or semi-cured organic material on the display panel DP and the chip on film COF using a slit SLT. However, the method for forming the coating layer CL on the display panel DP and the chip on film COF is not limited to the aforementioned, that is, other well known methods for forming a non-cured or semi-cured organic material may be used instead.

By applying a fluid state coating layer CL on the display panel DP and the chip on film COF, the coating layer CL may be filled between the display panel DP and the chip on film COF.

In an exemplary embodiment, after forming the coating layer CL using the non-cured or semi-cured organic material, the additional coating layer ACL may be formed.

Referring to FIG. 7C, light (for example, ultraviolet UV light) may be applied to the coating layer CL and the additional coating layer ACL, thereby curing the coating layer CL and the additional coating layer ACL.

Although it is illustrated in the aforementioned drawings that the coating layer CL is formed and cured in a state where the display panel DP is not bent according to an exemplary embodiment, this is not meant as a limitation. For example, the coating layer CL may be formed and cured in a state where the display panel DP is bent. Alternatively, the coating layer CL may be formed in a state where the display panel DP is not bent, and then cured after the display panel DP is bent.

In the display device produced in the aforementioned method, the display panel DP may be bent in the bending area, and then assembled together with the polarizing plate POL, the window WD, the cushion member CS and the cover, etc.

In the display device according to an exemplary embodiment, the pads of the chip on film COF may be provided in various forms.

Figure 8A:
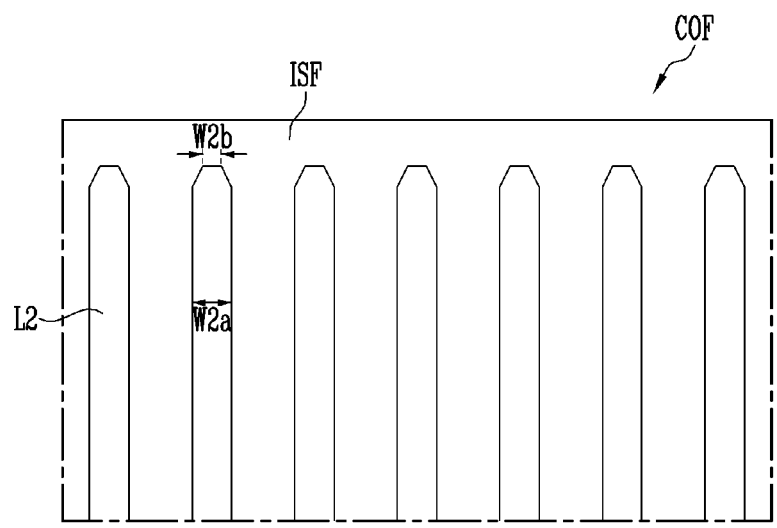
FIGS. 8A and 8B are plan views illustrating second pads of a chip on film according to an exemplary embodiment.
Figure 8B:
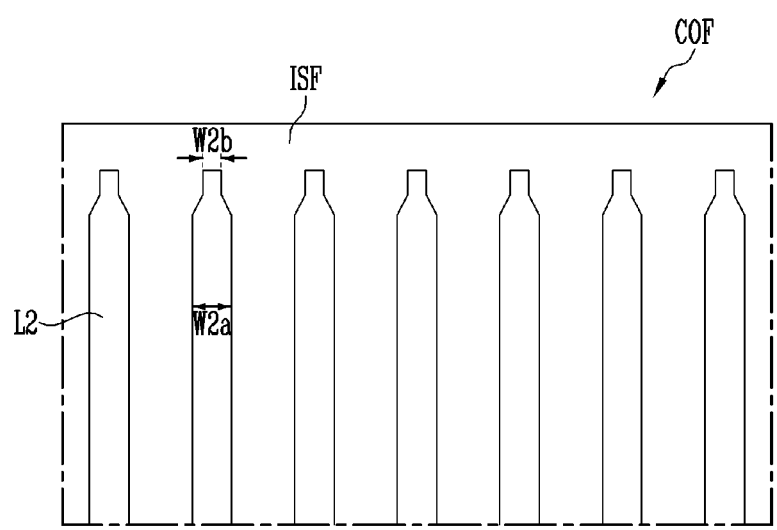

FIGS. 8A and 8B are plan views illustrating the second pads L2p of the chip on film COF.

Referring to FIGS. 8A and 8B, according to an exemplary embodiment of the present disclosure, the second pads L2P of the chip on film COF may sequentially have a third width W2a and a fourth width W2b that are different from each other in a direction moving away from the edge of the insulating film ISF. In an exemplary embodiment, in the second pads L2P, assuming that the width of the second pads L2P farther away from the edge of the insulating film ISF is the third width W2a and the width of the second pads L2P closer to the edge of the insulating film ISF is the fourth width W2b, the fourth width W2b may be smaller than the third width W2a.

Regarding the second pads L2P, the closer it is to the edge of the insulating film ISF, the smaller its width, and thus extra organic polymer may be easily squeezed out when attaching the display panel DP and the chip on film COF.

In the display device according to an exemplary embodiment, the solder resist layer SR (see FIG. 7C) may be provided in various forms.

Figure 9:
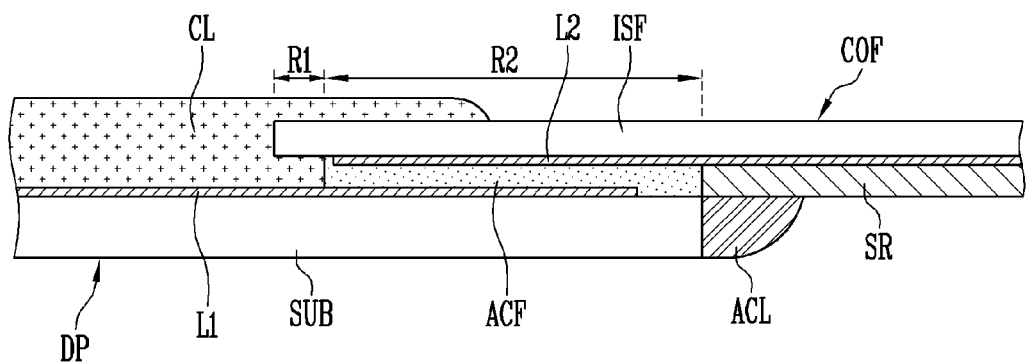
FIG. 9 is a view illustrating a display device according to an exemplary embodiment.

FIG. 9 is a cross-sectional view of the display device according to an exemplary embodiment of the present disclosure, where the solder resist layer SR is formed differently.

According to an exemplary embodiment, the solder resist layer SR may be provided so as to not overlap with the display panel DP in a plan view. The shape and the location of the solder resist layer SR may vary as long as it protects the second lines L2.

According to the aforementioned exemplary embodiment, as the second pads L2P are spaced apart from the edge of the insulating film and the second lines L2 are prevented from being corroded. In the case where the second lines L2 contact the edge of the insulating film, if moisture or oxygen infiltrates from outside, the second lines L2 may be easily corroded, which is a problem. However, according to the exemplary embodiments of the present disclosure, the second pads L2P do not directly contact the edge of the insulating film, and the space from the edge of the insulating film to the end of the second lines L2 may be covered by the coating layer CL, and thus the second lines L2P are prevented from being corroded.

Thus, according to the aforementioned embodiments, lines of a chip on film may be prevented from being corroded as they are spaced apart from an edge of an insulating film.

The display device according to an embodiment of the present disclosure may be adopted to various kinds of electronic devices. For example, the display device may be applied to various wearable devices such as TV, notebook, mobile phone, smart phone, smart pad, PMP, PDA and navigation, etc.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device, comprising:
   a display panel comprising a substrate, pixels provided on the substrate, and first lines connected to the pixels, wherein the display panel comprises a bending area where the display panel is bent;
   a chip on film overlapping with a portion including an end portion of the display panel and comprising second lines;
   a first coating layer covering the bending area and one end of a surface of the chip on film; and
   a second coating layer provided in the end portion of the display panel and covering another surface of the chip on film,
   wherein the first coating layer and the second coating layer are spaced apart from each other.

2. The display device of claim 1, wherein the first lines are provided on a neutral plane.

3. The display device of claim 1, wherein:
   the chip on film comprises:
      an insulating film comprising a first surface and a second surface opposite the first surface;
      the second lines disposed on the first surface; and
      pads disposed on ends of the second lines; and
   the pads are spaced apart from an edge of the insulating film in a plan view.

4. The display device of claim 3, further comprising a conductive layer electrically connecting the first lines and the second lines,
   wherein the conductive layer overlaps with the pads of the chip on film, and is spaced apart from the edge of the insulating film in a plan view.

5. The display device of claim 4, wherein:
   the chip on film comprises a first area that contacts an end of the insulating film but does not overlap with the conductive layer and a second area that overlaps with the conductive layer; and
   a space between the first area of the chip on film and the display panel is filled by the first coating layer.

6. The display device of claim 3, wherein each of the pads has a first width and a second width positioned sequentially in a direction moving away from the edge of the insulating film.

7. The display device of claim 6, wherein the first width and the second width are different from each other.

8. The display device of claim 7, wherein the first width is less than the second width.

9. The display device of claim 3, wherein the first coating layer covers a portion of the second surface of the insulating film.

10. The display device of claim 9, further comprising a solder resist layer disposed on the first surface of the insulating film and covering at least a portion of the second lines.

11. The display device of claim 10, wherein the solder resist layer overlaps with the display panel in a plan view.

12. The display device of claim 10, wherein the solder resist layer does not overlap with the display panel.

13. The display device of claim 1, wherein:
the substrate comprises:
a display area in which the pixels are provided;
a non-display area disposed in at least one side of the display area; and
the bending area disposed in the non-display area, and
the non-display area comprises an additional area protruding from a portion of the non-display area, and the display panel is bent in the additional area.

14. The display device of claim 13, wherein one end of the chip on film overlaps with the additional area.

15. The display device of claim 14, further comprising a printed circuit board connected to another end of the chip on film.

16. The display device of claim 15, wherein:
the display panel comprises a first flat area comprising the display area, a second flat area spaced apart from the first flat area, and the bending area disposed between the first flat area and the second flat area; and
the first flat area and the second flat area are parallel to each other.

17. The display device of claim 16, wherein:
the first coating layer covers an outer circumference of the display panel in the bending area; and
the first coating layer covers a portion of the first flat area and the second flat area.

18. The display device of claim 17, wherein the first coating layer comprises a photosetting material.

19. The display device of claim 1, wherein the first coating layer and the second coating layer include a same material as each other.

* * * * *